(12) United States Patent
Fukada

(10) Patent No.: US 7,018,854 B2
(45) Date of Patent: Mar. 28, 2006

(54) SEMICONDUCTOR DEVICE AND METHOD FOR MANUFACTURING THE SAME

(75) Inventor: Shinichi Fukada, Hamura (JP)

(73) Assignee: Seiko Epson Corporation, Tokyo (JP)

( * ) Notice: Subject to any disclaimer, the term of this patent is extended or adjusted under 35 U.S.C. 154(b) by 5 days.

(21) Appl. No.: 10/849,016

(22) Filed: May 20, 2004

(65) Prior Publication Data
US 2005/0001250 A1    Jan. 6, 2005

(30) Foreign Application Priority Data
May 30, 2003 (JP) .............................. 2003-155870

(51) Int. Cl.
*H01L 21/00* (2006.01)
*H01L 21/8242* (2006.01)
*H01L 21/20* (2006.01)
*H01L 31/119* (2006.01)
*H01L 29/76* (2006.01)
*H01L 29/94* (2006.01)

(52) U.S. Cl. .......................... 438/3; 438/239; 438/240; 438/942; 438/396; 257/295; 257/305

(58) Field of Classification Search ................... 438/3, 438/942, 239, 240, 396; 257/295, 305
See application file for complete search history.

(56) References Cited

U.S. PATENT DOCUMENTS

| 5,401,680 A | * | 3/1995 | Abt et al. ...................... 438/3 |
| 5,801,410 A | * | 9/1998 | Kim ........................... 257/295 |
| 6,850,429 B1 | * | 2/2005 | Rinerson et al. ............ 365/158 |

FOREIGN PATENT DOCUMENTS

JP      A-9-116107      5/1997

* cited by examiner

*Primary Examiner*—Steven Loke
*Assistant Examiner*—Samuel A Gebremariam
(74) *Attorney, Agent, or Firm*—Oliff & Berridg, PLC

(57) ABSTRACT

The invention provides a semiconductor device and a method for manufacturing the same that are capable of improving the product performance and operational efficiency of a cross-point FeRAM, as well as increasing the area of capacitors included in the cross-point FeRAM. An upper electrode supporting layer forming mask for forming an upper electrode supporting layer can be made of a hard mask material. By making use of the upper electrode supporting layer forming mask remaining unremoved in forming and processing a lower electrode layer, prior to forming an upper electrode layer, a region where a ferroelectric capacitor is formed can be made larger than an area occupied by an intersection of the upper electrode layer and the lower electrode layer.

4 Claims, 5 Drawing Sheets

SEMICONDUCTOR DEVICE AND METHOD FOR MANUFACTURING THE SAME

BACKGROUND OF THE INVENTION

1. Field of Invention

The present invention relates to a semiconductor device including a plurality of ferroelectric capacitors and a method for manufacturing the same. More particularly, the invention relates to technology useful for forming a plurality of ferroelectric capacitors of uniform dimensions.

2. Description of Related Art

As a larger scale integration and smaller configuration of a semiconductor device have been achieved in recent years, a cross-point FeRAM has drawn attention as a semiconductor device having ferroelectric capacitors. In the cross-point FeRAM, upper electrode layers and lower electrode layers laid out in a matrix are deposited with a ferroelectric layer therebetween, and a plurality of ferroelectric capacitors are provided at each intersection of the upper electrode layers and the lower electrode layers. See, for example, Japanese Unexamined Patent Application Publication No. 9-116107.

Referring to FIG. 5, a widely used method for manufacturing such a cross-point FeRAM will now be described. FIG. 5 is a sectional view illustrating steps of a conventional method for manufacturing a semiconductor device.

Initially, a lower electrode layer forming film (not shown in the drawing), a ferroelectric layer forming film (not shown in the drawing), and an upper electrode supporting layer forming film 200c are provided in this order by using a known sputtering method on the upper surface of an interlayer insulating layer formed on a semiconductor substrate on which a MOS transistor or the like have been provided in a step not being illustrated in the drawing. As shown in FIG. 5(*a*), a lower electrode layer forming mask M100 on which a pattern for forming lower electrode layers in the column direction (in the horizontal direction of FIG. 5) has been formed can be deposited on the upper surface of the upper electrode supporting layer forming film 200c.

Subsequently, as shown in FIG. 5(*b*), the upper electrode supporting layer forming film 200c, the ferroelectric layer forming film (not shown in the drawing), and the lower electrode layer forming film (not shown in the drawing) are removed all at once, except for regions where a lower electrode layer is to be formed, by using a known photolithography and etching technique. Thus, a multilayer for forming a capacitor made up of a lower electrode layer (not shown in the drawing), a ferroelectric layer (not shown in the drawing), and an upper electrode supporting layer 200C can be provided in multiple numbers only in the regions where a lower electrode layer is to be formed on an interlayer insulating layer 100.

Next, as shown in FIG. 5(*c*), an insulating layer 300 is provided on the whole upper surface of the interlayer insulating layer, where the multilayer for forming a capacitor is provided in the regions where a lower electrode layer is to be formed, by using a known chemical vapor deposition (CVD) method.

Then the whole upper surface of the insulating layer 300 is planarized by a known etchback or chemical mechanical polishing (CMP) method. Subsequently, a via hole V100 is formed reaching from the upper surface of the insulating layer 300 to the upper surface of the upper electrode supporting layer 200C, where a ferroelectric capacitor C is to be formed.

Subsequently, as shown in FIG. 5(*d*), an upper electrode layer forming film (not shown in the drawing) is provided on the whole upper surface of the insulating layer 300, where the via hole V100 is formed, by using a known sputtering method. Then an upper electrode layer 200D is provided in multiple numbers in the row direction (in the vertical direction of FIG. 5) in regions where the upper electrode is to be formed, including the regions where the ferroelectric capacitor C is to be formed, by using a known photolithography and etching technique. Of the multilayer for forming a capacitor, the upper electrode supporting layer 200C here is removed by etching to form the upper electrode layer forming film except for the regions where the ferroelectric capacitor C is to be formed, and thereby a ferroelectric layer 200B on a lower electrode layer 200A can be exposed.

Thus, the upper electrode layer 200D and the lower electrode layer 200A, provided in multiple numbers in a matrix, are deposited with the ferroelectric layer 200B and the upper electrode supporting layer 200C therebetween, and the ferroelectric capacitor C is provided in multiple numbers, each provided at an intersection of the upper electrode layer 200D and the lower electrode layer 200A.

SUMMARY OF THE INVENTION

The above-described method for manufacturing a cross-point FeRAM has an advantage of causing no alignment deviation among the upper electrode supporting layer forming film 200C, the ferroelectric layer forming film, and the lower electrode layer forming film, since the three are etched at once. The etching of the three layers of different materials, however, results in low processing accuracy, makes it difficult to form a plurality of ferroelectric capacitors of uniform dimensions on one single semiconductor substrate, and moreover, adversely affects the operational efficiency required for an etching process.

Here another problem can arise. The ferroelectric capacitor C is self-aligned to an intersection of the lower electrode layer 200A and the upper electrode layer 200D, which are provided in multiple numbers in a matrix. Therefore, the dimensions of the ferroelectric capacitor C can be adjusted and defined by changing the line width of the lower electrode layer 200A and the upper electrode layer 200D. To increase the dimensions of the ferroelectric capacitor C, it is required to increase the line width of the lower electrode layer 200A and the upper electrode layer 200D. This enlarges a capacitor array area, where the lower electrode layer 200A and the upper electrode layer 200D are provided in multiple numbers in a matrix, and thereby increasing a total size of the device.

An aspect of the invention aims to provide a semiconductor device and a method for manufacturing the same that are capable of improving the product performance and operational efficiency of a cross-point FeRAM and controlling the dimensions of ferroelectric capacitors without changing the line width of the lower electrode layer and the upper electrode layer.

A method for manufacturing a semiconductor device according to a first aspect of the invention can include defining a region where a ferroelectric capacitor is formed by using a mask for forming and processing a lower electrode layer or an upper electrode supporting layer prior to forming an upper electrode layer. The method is for manufacturing a semiconductor device in which the lower electrode layer extending in a first direction and the upper electrode layer extending in a second direction are provided on a semiconductor substrate with a ferroelectric layer and the upper electrode supporting layer therebetween, and the ferroelectric capacitor is provided at an intersection of the lower electrode layer and the upper electrode layer.

Also in the method for manufacturing a semiconductor device according to the first aspect of the invention, a dimension in the first direction of the region where the ferroelectric capacitor is formed may be larger than the width of the upper electrode layer.

Also in the method for manufacturing a semiconductor device according to the first aspect of the invention, a dimension in the second direction of the region where the ferroelectric capacitor is formed may be larger than the width of the lower electrode layer.

A method for manufacturing a semiconductor device according to a second aspect of the invention can include depositing a lower electrode layer forming film, a ferroelectric layer forming film, and an upper electrode supporting layer forming film in this order on a semiconductor substrate, depositing an upper electrode supporting layer forming mask on the upper electrode supporting layer forming film, forming an upper electrode supporting layer in a region where a ferroelectric capacitor is formed by using the upper electrode supporting layer forming mask, depositing a lower electrode layer forming mask on the ferroelectric layer forming film in the presence of the upper electrode supporting layer forming mask, and forming a ferroelectric layer and a lower electrode layer in the region where the ferroelectric capacitor is formed and in a region where the lower electrode layer is formed extending in a first direction including the region where the ferroelectric capacitor is formed, respectively, by using the upper electrode supporting layer forming mask and the lower electrode layer forming mask. The method can further include forming an insulating layer on the whole upper surface of the semiconductor substrate from which the upper electrode supporting layer forming mask and the lower electrode layer forming mask have been removed, exposing an upper surface of the upper electrode supporting layer that is to be the region where the ferroelectric capacitor is formed to an upper surface of the insulating layer, and forming an upper electrode layer extending in a second direction on the insulating layer to which the upper surface of the upper electrode supporting layer has been exposed so as to include the region where the ferroelectric capacitor is formed. The method is for manufacturing a semiconductor device in which the lower electrode layer extending in the first direction and the upper electrode layer extending in the second direction are provided on the semiconductor substrate with the ferroelectric layer and the upper electrode supporting layer therebetween, and the ferroelectric capacitor is provided at an intersection of the lower electrode layer and the upper electrode layer.

Also in the method for manufacturing a semiconductor device according to the second aspect of the invention, the upper electrode supporting layer forming mask may be made of a material having an etching resistance higher than that of the lower electrode layer forming mask.

Also in the method for manufacturing a semiconductor device according to the second aspect of the invention, the lower electrode layer forming mask may be made of a material having an etching resistance higher than that of the upper electrode supporting layer forming mask.

Also in the method for manufacturing a semiconductor device according to the second aspect of the invention, the upper electrode supporting layer may be made larger than an area to be occupied by an intersection of the upper electrode layer and the lower electrode layer by using the upper electrode supporting layer forming mask.

A semiconductor device according to another aspect of the invention includes a ferroelectric capacitor formed in a region larger than an area occupied by an intersection of a lower electrode layer and an upper electrode layer. In the semiconductor device, the lower electrode layer extending in a first direction and the upper electrode layer extending in a second direction are provided on a semiconductor substrate with a ferroelectric layer and an upper electrode supporting layer therebetween, and the ferroelectric capacitor is provided at the intersection of the lower electrode layer and the upper electrode layer.

Also in the semiconductor device according to another aspect of the invention, a dimension in the first direction of the region where the ferroelectric capacitor is formed may be larger than the width of the upper electrode layer.

Also in the semiconductor device according to another aspect of the invention, a dimension in the second direction of the region where the ferroelectric capacitor is formed may be larger than the width of the lower electrode layer.

With such a method for manufacturing a semiconductor device by defining the region where the ferroelectric capacitor is formed using a mask for forming and processing the lower electrode layer or the upper electrode supporting layer prior to forming the upper electrode layer, it is possible to define the dimensions of the ferroelectric capacitor independently of the area occupied by an intersection of the upper electrode layer and the lower electrode layer. This enables adjustment of the dimensions of the ferroelectric capacitor without changing the line width of the upper electrode layer and the lower electrode layer.

By making the upper electrode supporting layer forming mask of a material having an etching resistance higher than that of the lower electrode layer forming mask, the upper electrode supporting layer forming mask remains unremoved in forming and processing the lower electrode layer. This makes it possible to define the region where the ferroelectric capacitor is formed as the same dimensions as the upper electrode supporting layer forming mask.

Here, by making the lower electrode layer forming mask of a material having an etching resistance higher than that of the upper electrode supporting layer forming mask, the upper electrode supporting layer forming mask protruding from the lower electrode layer forming mask is removed in forming and processing the lower electrode layer. Therefore, a dimension in one direction (in which the lower electrode layer extends) of the ferroelectric capacitor depends on the dimension of the upper electrode supporting layer forming mask, while a dimension in the other direction (in which the upper electrode layer extends) of the ferroelectric capacitor depends on the dimension of the lower electrode layer forming mask.

In other words, by making the region where the ferroelectric capacitor is formed larger than the area occupied by an intersection of the upper electrode layer and the lower electrode layer, it can be possible to increase the dimensions of the ferroelectric capacitor without enlarging a capacitor array area, and thereby achieving advanced product performance of the ferroelectric capacitor and a smaller configuration of devices.

Moreover, by using the upper electrode supporting layer forming mask or the lower electrode layer forming mask with different etching resistances for defining the region where the ferroelectric capacitor is formed, it is possible to reduce alignment deviations among the upper electrode supporting layer, the ferroelectric layer, and the lower electrode layer even if these layers are separately formed, instead of forming them all at once as is the case with conventional methods.

Thus, it is possible to increase accuracy in processing the ferroelectric capacitor without causing alignment deviations among each layer making up the ferroelectric capacitor, and thereby improving operational efficiency required for the etching process as well as providing a smaller configuration of the ferroelectric capacitor with stable product performance. At the same time, by increasing accuracy in processing the ferroelectric capacitor, it is possible to provide the ferroelectric capacitor in multiple numbers of uniform dimensions on one single semiconductor substrate. This eventually can enhance product performance of the semiconductor device.

With such a semiconductor device, which includes the ferroelectric capacitor formed in a region larger than the area occupied by an intersection of the lower electrode layer and the upper electrode layer, it is possible to improve product performance of the ferroelectric capacitor compared to conventional configurations having the ferroelectric capacitor confined in the intersection.

BRIEF DESCRIPTION OF THE DRAWINGS

The invention will be described with reference to the accompanying drawings, wherein like numerals reference like elements, and wherein:

FIG. 1 shows a configuration example of a semiconductor device of an embodiment of the invention where

FIG. 3 shows a configuration example of a semiconductor device of another embodiment of the invention, where

DETAILED DESCRIPTION OF PREFERRED EMBODIMENTS

Embodiments of the invention will now be described with reference to the accompanying drawings. It should be understood that the embodiments are described by way of example, and not intended to limit the invention.

Figure 1A:
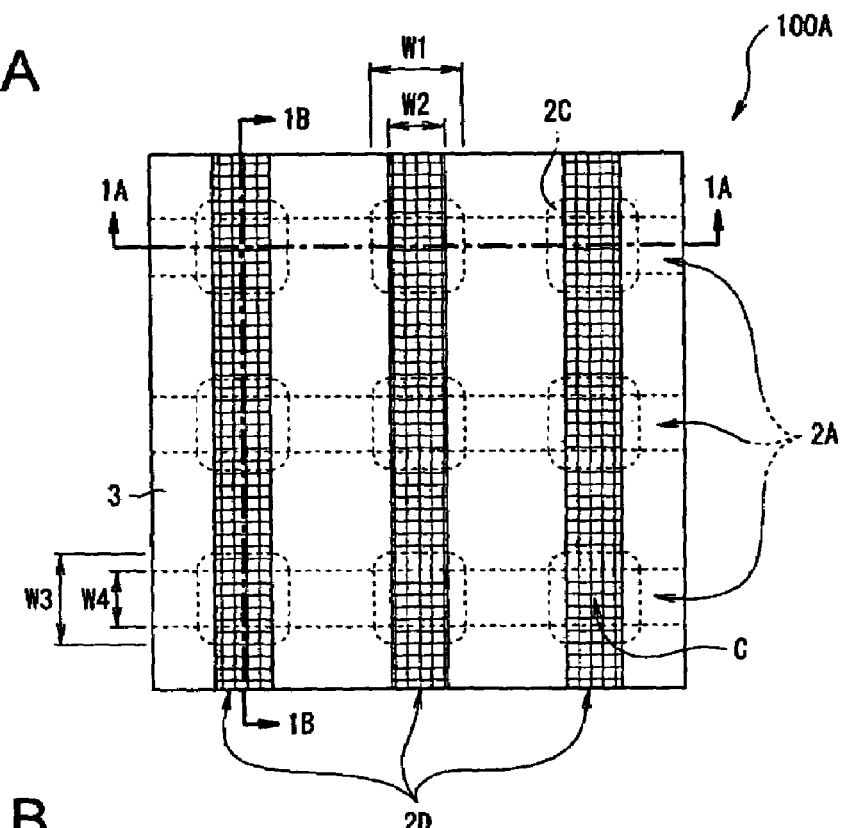
FIG. 1(a) is a plan view.
Figure 1B:
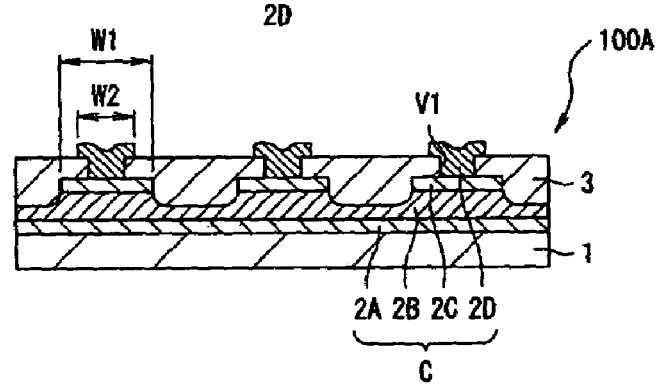
FIG. 1(b) is a sectional view of the semiconductor device along the line 1A—1A in FIG. 1(a)
Figure 1C:
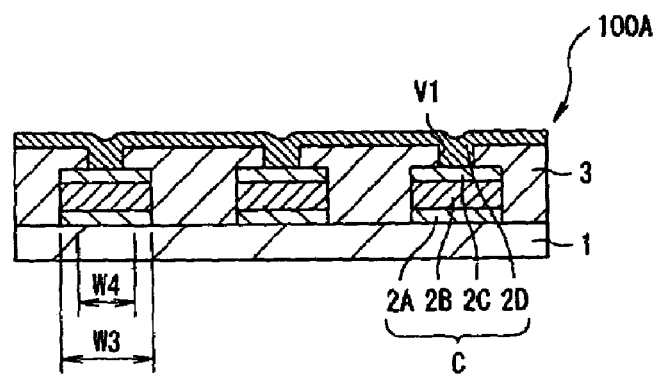
FIG. 1(c) is a sectional view of the semiconductor device along the line 1B—1B in FIG. 1(a)

FIG. 1 shows a configuration example of a semiconductor device of the invention. FIG. 1(a) is a plan view, FIG. 1(b) is a sectional view of the semiconductor device along the line 1A—1A in FIG. 1(a), and FIG. 1(c) is a sectional view of the semiconductor device along the line 1B—1B in FIG. 1(a).

A semiconductor device 100A of this embodiment, as shown in FIG. 1(a), has a cross-point FeRAM including a ferroelectric capacitor C provided in multiple numbers each at an intersection of a lower electrode layer 2A provided in multiple numbers in the row direction (in the horizontal direction of FIG. 1(a)) and an upper electrode layer 2D provided in multiple numbers in the column direction (in the vertical direction of FIG. 1(a)) on a semiconductor substrate (not shown in the drawing).

The ferroelectric capacitor C, as shown in FIGS. 1(b) and (c), is made up of the lower electrode layer 2A, a ferroelectric layer 2B, an upper electrode supporting layer 2C, and the upper electrode layer 2D, which are deposited in this order on an interlayer insulating layer 1 formed on the semiconductor substrate. As shown in FIG. 1(a), a multilayer made up of the lower electrode layer 2A, the ferroelectric layer 2B, and the upper electrode supporting layer 2C, which form the ferroelectric capacitor C, is formed so as to make a width W1 in rows wider than a width W2 of the upper electrode layer 2D and a width W3 in columns wider than a width W4 of the lower electrode layer 2A.

An insulating layer 3 can be provided on the upper surface of the lower electrode layer 2A provided in the row direction, except for regions where the ferroelectric capacitor C is formed (hereinafter called ferroelectric capacitor C regions) with the ferroelectric layer 2B therebetween as shown in FIG. 1(b). Here, it is also possible to thoroughly remove the ferroelectric layer 2B except for the ferroelectric capacitor C regions, and provide the insulating layer 3 directly on the lower electrode layer 2A.

Meanwhile, the insulating layer 3 can be provided on the interlayer insulating layer 1 under the upper electrode layer 2D, provided in the column direction, except for the ferroelectric capacitor C regions as shown in FIG. 1(c). The upper electrode supporting layer 2C is connected to the upper electrode layer 2D through a via hole V1 only in the ferroelectric capacitor C regions.

A method for manufacturing the semiconductor device 100A of this embodiment will now be described.

FIG. 2 is a plan view illustrating one process of manufacturing the semiconductor device according to the invention. According to the method for manufacturing the semiconductor device 100A of this embodiment, the interlayer insulating layer 1 that is made of, for example, a silicon oxide layer is formed 1500 nm thick on the whole upper surface of the semiconductor substrate, on which a MOS transistor has been provided, by using a known CVD method.

Figure 2C:
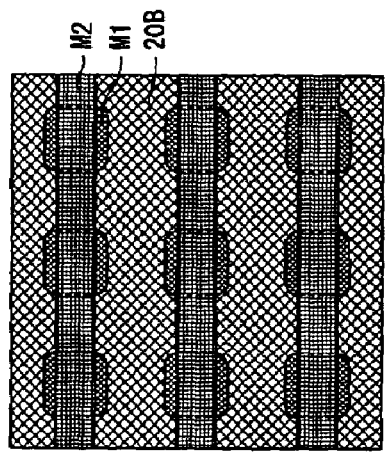
FIG. 2 is a sectional view illustrating the process of manufacturing the semiconductor device according to the present embodiment.
Figure 2B:
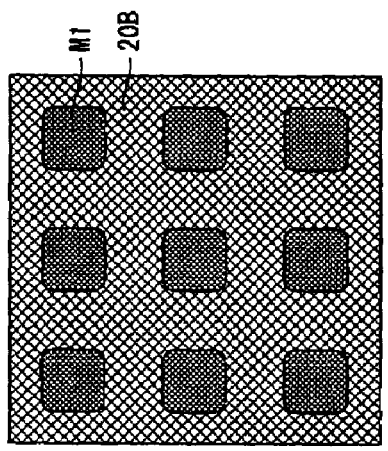
Figure 2E:
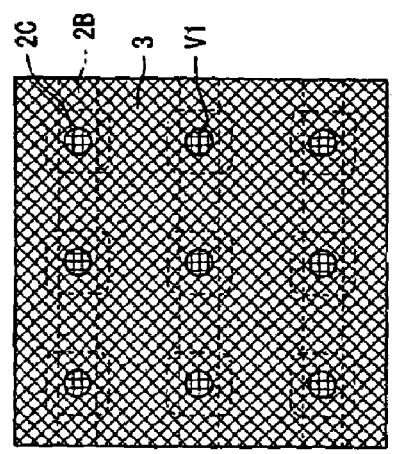
Figure 2A:
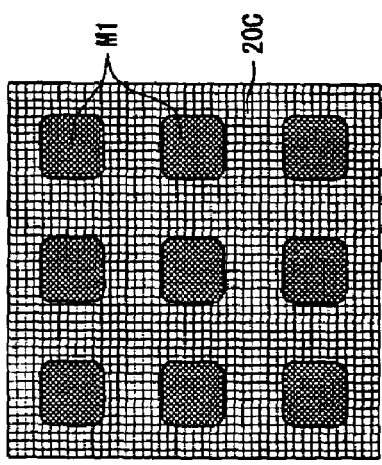

Then as shown in FIG. 2(a), by using a known sputtering method for example, a lower electrode layer forming film (not shown in the drawing) made of Pt or the like, a ferroelectric layer forming film (not shown in the drawing) made of SBT ($SrBi_2Ta_2O_9$), PZT ($Pb(Zr_xTi_{1-x})O_3$) or the like, and an upper electrode supporting layer forming film 20C made of Pt or the like are formed to a thickness of 200 nm each in this order on the whole surface of the interlayer insulating layer 1.

Next, a film (not shown in the drawing) for forming an upper electrode supporting layer forming mask M1 made of a hard mask material, such as a titanium nitride film or a tungsten film, is formed 100 nm thick on the whole surface of the upper electrode supporting layer 20C by using a known sputtering method for example. Subsequently, the upper electrode supporting layer forming mask M1 is formed in the ferroelectric capacitor C regions on the upper electrode supporting layer forming film 20C by using a known photolithography and etching technique. Here the upper electrode supporting layer forming mask M1 covers the ferroelectric capacitor C regions wider than regions where the upper electrode layer and the lower electrode layer are to intersect. Thus, the dimensions of the ferroelectric capacitor C regions depend on the area of the upper electrode supporting layer forming mask M1.

Then, as shown in FIG. 2(b), a known etching method is used under the condition that the upper electrode supporting layer forming film 20C can be removed using the upper electrode supporting layer forming mask M1, so as to remove the upper electrode supporting layer 2C except for the ferroelectric capacitor C regions. On the interlayer insulating layer 1 except for the ferroelectric capacitor C regions, the ferroelectric layer forming film 20B is exposed. Meanwhile, the upper electrode supporting layer 2C is formed directly under the upper electrode supporting layer forming mask M1 in the ferroelectric capacitor C regions.

Next, as shown in FIG. 2(c), on the whole upper surface of the interlayer insulating layer 1 on which the upper electrode supporting layer forming mask M1 is provided, a film (not shown in the drawing) for forming a lower electrode layer forming mask M2 made of a resist mask material, such as a novolac resin, is deposited by using a known spin-coating method, for example.

Then, by using a known photolithography and etching technique, the lower electrode layer forming mask M2 is formed in regions where a lower electrode layer is to be formed (hereinafter called lower electrode layer regions running in the row direction, so as to cover the upper surface of the upper electrode supporting layer forming mask M1 provided in the ferroelectric capacitor C regions.

Figure 2D:
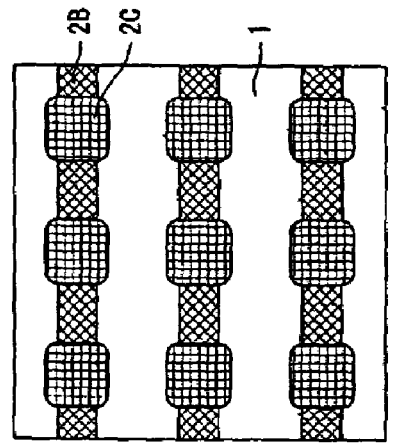

Subsequently, as FIG. 2(d) shows, a known etching method is used under the condition that the ferroelectric layer forming film 20B and the lower electrode layer forming film (not shown in the drawing) are removed using the upper electrode supporting layer forming mask M1 and the lower electrode layer forming mask M2, and thereby providing a multilayer of the lower electrode layer and the ferroelectric layer 2B in multiple numbers on the interlayer insulating layer 1 in the lower electrode layer 2A regions covered with the lower electrode layer forming mask M2. Here the upper electrode supporting layer forming mask M1 made of a hard mask material is not removed by the etching for forming the lower electrode layer. Thus, in the ferroelectric capacitor C regions covered with the mask M1, a multilayer of the lower electrode layer, the ferroelectric layer 2B, and the upper electrode supporting layer 2C is provided on the interlayer insulating layer 1. Meanwhile, in the area other than the ferroelectric capacitor C regions and the lower electrode layer 2A regions, the ferroelectric layer forming film 20B and the lower electrode layer forming film are removed, and thereby the interlayer insulating layer 1 is exposed. Then, the upper electrode supporting layer forming mask M1 and the lower electrode layer forming mask M2 are removed using a known technique.

Next, as shown in FIG. 2(e), the insulating layer 3 made of a silicon oxide film for example, is formed by using a known CVD method or the like on the whole upper surface of the interlayer insulating layer 1, where the ferroelectric layer 2B is exposed in the lower electrode layer regions while the upper electrode supporting layer 2C is exposed in the ferroelectric capacitor C regions.

Then planarization is accomplished on the whole upper surface of the insulating layer 3 by a known chemical mechanical polishing (CMP) method. Subsequently, a via hole V1 is formed reaching from the upper surface of the insulating layer 3 to the upper surface of the upper electrode supporting layer 2C by using a known photolithography and etching technique.

Next, an upper electrode layer forming film (not shown in the drawing) made of Pt is formed on the whole upper surface of the insulating layer 3 having the via hole V100 by using a known sputtering method. Then, the upper electrode layer 2D is provided in multiple numbers in the column direction so as to include the ferroelectric capacitor C regions, as shown in FIG. 1, by using a known photolithography and etching technique. Thus, the upper electrode layer 2D and the lower electrode layer 2A are provided in multiple numbers in a matrix, which completes a cross-point FeRAM having the ferroelectric capacitor C at each intersection of the two layers. The ferroelectric capacitor C is larger than the area occupied by the intersection.

According to the method for manufacturing the semiconductor device 100A of the first embodiment, the upper electrode supporting layer forming mask M1 can be made of a hard mask material having an etching resistance higher than that of the lower electrode layer forming mask M2. By making use of the mask M1 in defining the ferroelectric capacitor C regions, the dimensions of the ferroelectric capacitor C are made up of the dimensions of the upper electrode supporting layer forming mask M1 (namely, the area other than the intersection of the upper electrode layer 2D and the lower electrode layer 2A). This makes it possible to adjust the dimensions of the ferroelectric capacitor C without changing the line width of the upper electrode layer 2D and the lower electrode layer 2A.

Also according to the method for manufacturing the semiconductor device 100A of the first embodiment, the upper electrode supporting layer forming mask M1 is deposited so as to make its width in rows wider than the width W4 of the upper electrode layer 2D and make its width in columns wider than the width W4 of the lower electrode layer 2A. As a result, each ferroelectric capacitor C region can be made larger than the area where the upper electrode layer 2D and the lower electrode layer 2A intersect. This makes it possible to improve product performance of the ferroelectric capacitor C without increasing the total size of the device.

Moreover, by making use of the upper electrode supporting layer forming mask M1 made of a hard mask material for defining the ferroelectric capacitor C regions, it is possible to reduce alignment deviations among the upper electrode supporting layer 2C, the ferroelectric layer 2B, and the lower electrode layer 2A even if these layers are separately formed, instead of forming them all at once as is the case with conventional methods.

Thus, it can be possible to increase accuracy in processing the ferroelectric capacitor C without causing alignment deviations among each layer of the ferroelectric capacitor C, and thereby improving operational efficiency required for the etching process as well as providing a smaller configuration of the ferroelectric capacitor C with stable product performance. At the same time, as the accuracy in processing the ferroelectric capacitor C increases, the ferroelectric capacitor C can be provided in multiple numbers of uniform dimensions on one single semiconductor substrate. This eventually enhances product performance of the semiconductor device 100A.

Figure 3A:
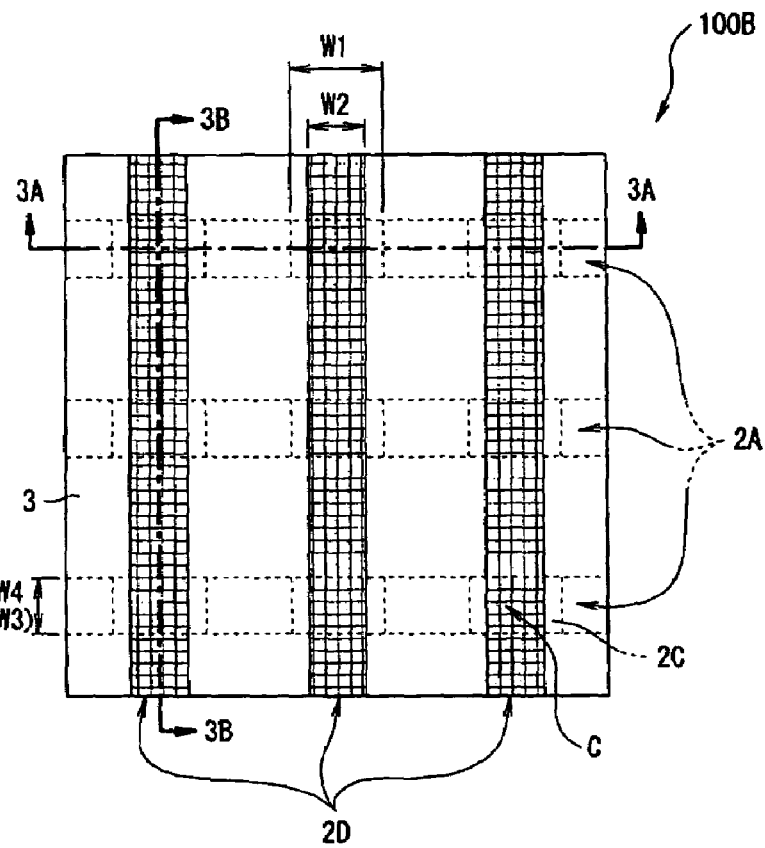
FIG. 3(a) is a plan view.
Figure 3B:
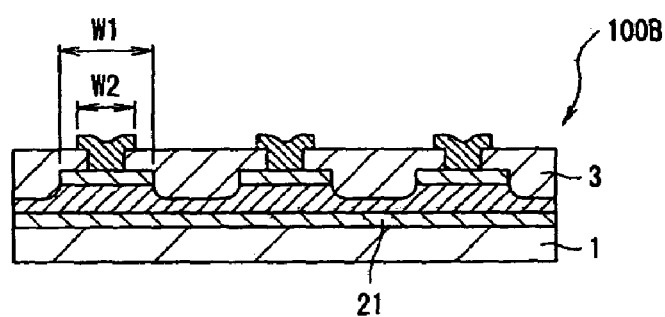
FIG. 3(b) is a sectional view of the semiconductor device along the line 3A—3A in FIG. 3(a)
Figure 3C:
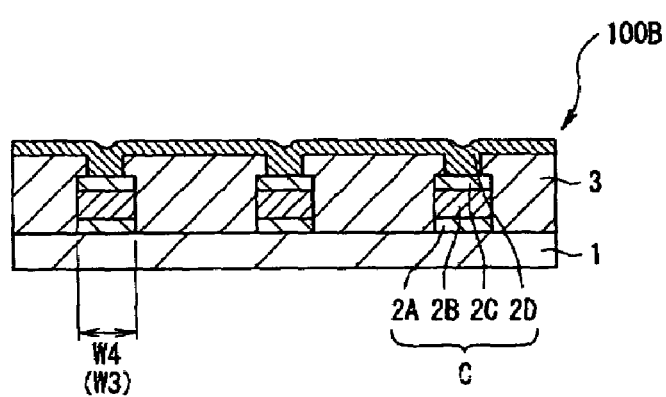
FIG. 3(c) is a sectional view of the semiconductor device along the line 3B—3B in FIG. 3(a)

FIG. 3 shows another configuration example of a semiconductor device according to the invention. FIG. 3(a) is a plan view, FIG. 3(b) is a sectional view of the semiconductor device along the line 3A—3A in FIG. 3(a), and FIG. 3(c) is a sectional view of the semiconductor device along the line 3B—3B in FIG. 3(a).

A semiconductor device 100B of this embodiment is different from the semiconductor device 100A of the first embodiment in that a multilayer made up of the lower electrode layer 2A, the ferroelectric layer 2B, and the upper electrode supporting layer 2C forming the ferroelectric capacitor C can be formed so as to make its width W1 in rows (in the horizontal direction of FIG. 3) wider than the width W4 of the upper electrode layer 2D and make its width W3 in columns (in the vertical direction of FIG. 3) equal to the width W4 of the lower electrode layer 2A.

Below is an explanation of a method for manufacturing the semiconductor device 100B of the present embodiment.

FIG. 4 is a plan view illustrating another process of manufacturing the semiconductor device according to the invention. The semiconductor device 100B of this embodiment goes through the same process as the method for manufacturing the semiconductor device 100A of the first embodiment as shown in FIGS. 4(a) through (c). In addition, a lower electrode layer forming mask M4 is deposited on an upper electrode supporting layer forming mask M3, which has been used for forming the upper electrode supporting layer 2C, in this embodiment. This is different from the semiconductor device 100A of the first embodiment in that the upper electrode supporting layer forming mask M3 is made of a spin-on-glass (SOP, or coating glass) material and the lower electrode layer forming mask is made of a hard mask material.

Figure 4C:
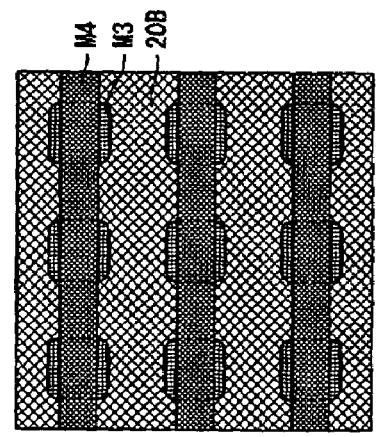
FIG. 4 is a plan view illustrating the process of manufacturing the semiconductor device according to the present embodiment.
Figure 4B:
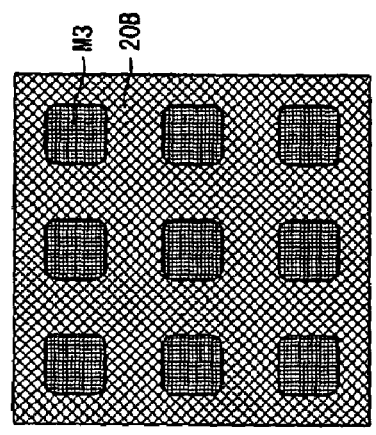
Figure 4E:
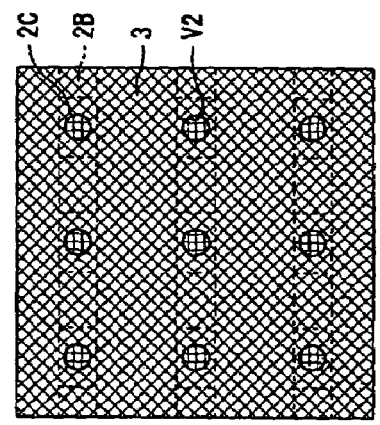
Figure 4A:
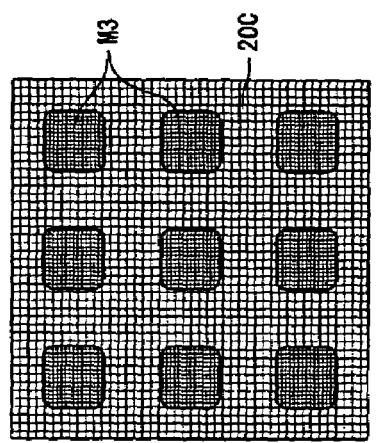
Figure 4D:
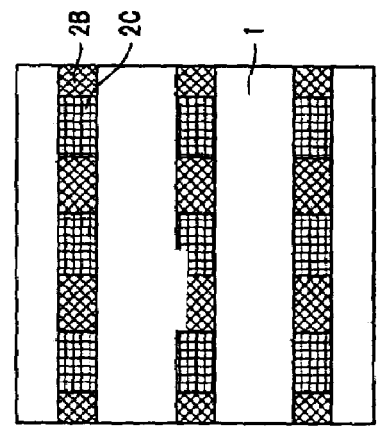
Figure 5B:
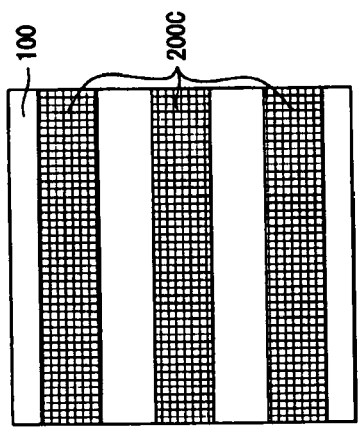
FIG. 5 is a plan view showing a conventional way of manufacturing a semiconductor device.
Figure 5D:
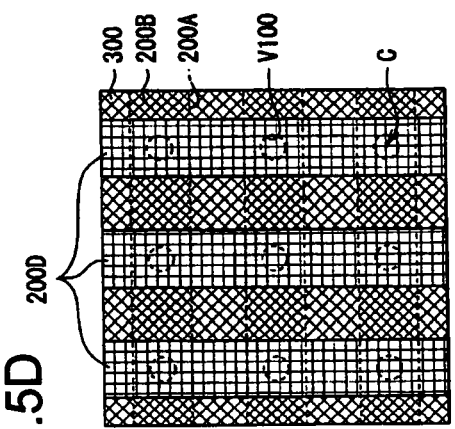
Figure 5A:
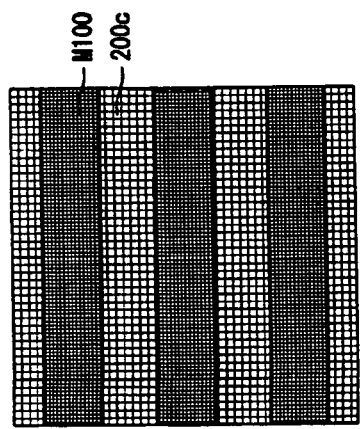
Figure 5C:
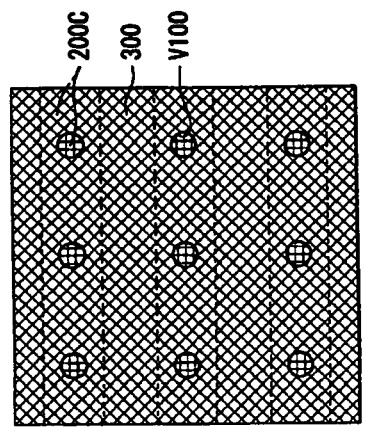

Therefore, as FIG. 4(d) shows, when a known etching method is used under the condition that the ferroelectric layer forming film 20B and the lower electrode layer forming film (not shown in the drawing) are removed in the presence of the lower electrode layer forming mask M4 provided on the upper electrode supporting layer forming mask M3, the upper electrode supporting layer forming mask M3 having a low etching resistance is also removed, whereas the lower electrode layer forming mask M4 having a high etching resistance is not removed. Consequently, a multilayer of the lower electrode layer 2A and the ferroelectric layer 2B can be provided in multiple numbers on the interlayer insulating layer 1 included in the lower electrode layer 2A regions covered with the lower electrode layer forming mask M4. At the same time, a multilayer of the lower electrode layer (not shown in the drawing), the ferroelectric layer 2B, and the upper electrode supporting layer 2C is provided on the interlayer insulating layer 1 on which the lower electrode layer forming mask M4 is provided, which is included in the ferroelectric capacitor C regions covered with the upper electrode supporting layer forming mask M3.

At this point, the dimensions of the ferroelectric capacitor C regions are defined. Thus, by performing etching using the lower electrode layer forming mask M4 made of a hard mask material and the upper electrode supporting layer forming mask M3 made of an SOG material, part of the ferroelectric capacitor C regions formed by using the upper electrode supporting layer forming mask M3 is removed, making its width W3 in columns equal to the width W4 of the lower electrode layer 2A. Subsequently, the lower electrode layer forming mask M4 and the upper electrode supporting layer forming mask M3 are removed using a known technique.

Next, as FIG. 4(e) shows, the insulating layer 3 is provided on the whole upper surface of an interlayer insulating layer 1 by going through the same manufacturing process as the semiconductor device 100A of the first embodiment, and then a via hole V2 is formed. Subsequently, the upper electrode layer 2D is provided in multiple numbers in regions where the upper electrode layer 2D is to be formed that run in rows including the ferroelectric capacitor C regions by going through the same manufacturing process as the semiconductor device 100A of the first embodiment as shown in FIGS. 3(b) and (c).

According to the method for manufacturing the semiconductor device 100B of the second embodiment, the lower electrode layer forming mask M4 can be made of a hard mask material having an etching resistance higher than that of the upper electrode supporting layer forming mask M3. By making use of the mask M4 in defining the ferroelectric capacitor C regions before forming the upper electrode layer 2D, the width W1 in rows of the ferroelectric capacitor C can be made equal to that of the upper electrode supporting layer forming mask M4, and the width W3 in columns of the ferroelectric capacitor C equal to that of the lower electrode layer forming mask M4. This makes it possible to adjust the dimensions of the ferroelectric capacitor C without changing the line width of the upper electrode layer 2D and the lower electrode layer 2A.

Also, according to the method for manufacturing the semiconductor device 100B of the second embodiment, since the width in rows of the upper electrode supporting layer forming mask M3 is made wider than the width W4 of the upper electrode layer 2D, the ferroelectric capacitor C is made larger than the area occupied by an intersection of the upper electrode layer 2D and the lower electrode layer 2A. This makes it possible to improve product performance of the ferroelectric capacitor C, like in the first embodiment, without increasing the total size of the device.

Moreover, by making use of the lower electrode layer forming mask M4 made of a hard mask material for defining the ferroelectric capacitor C regions, it is possible to increase accuracy in processing the ferroelectric capacitor C, like in the first embodiment, without causing alignment deviations among each layer of the ferroelectric capacitor C. This not only provides a smaller configuration of the ferroelectric capacitor C with stable product performance, but also improves operational efficiency required for the etching process.

While the via holes V1 and V2 reaching from the upper surface of the insulating layer 3 to the upper electrode supporting layer 2C are formed in order to expose the upper surface of the upper electrode supporting layer 2C to the upper surface of the insulating layer 3 in the first and second embodiments, it should be understood that the invention is not limited to this. After planarizing the insulating layer 3, the upper surface of the upper electrode supporting layer 2C may be exposed by means of etchback for the whole surface.

Also, while it is presupposed that a MOS transistor is provided with the ferroelectric capacitor C in the first and second embodiments, any other semiconductor devices may replace this as far as they are connectable to the ferroelectric capacitor C. Examples of such devices may include metal insulator semiconductor (MIS) transistors, such as a metal-oxide-nitride-oxide-semiconductor (MONOS) transistor.

What is claimed is:

1. A method for manufacturing a semiconductor device, comprising:
    depositing a lower electrode layer forming film, a ferroelectric layer forming film, and an upper electrode supporting layer forming film in this order on a semiconductor substrate;
    depositing an upper electrode supporting layer forming mask on the upper electrode supporting layer forming film;
    forming an upper electrode supporting layer in a region where a ferroelectric capacitor is formed by using the upper electrode supporting layer forming mask;
    depositing a lower electrode layer forming mask on the ferroelectric layer forming film in the presence of the upper electrode supporting layer forming mask;

forming a ferroelectric layer and a lower electrode layer in a region where the ferroelectric capacitor is formed and in a region where the lower electrode layer is formed extending in a first direction including the region where the ferroelectric capacitor is formed, respectively, by using the upper electrode supporting layer forming mask and the lower electrode layer forming mask;

forming an insulating layer on a whole upper surface of the semiconductor substrate from which the upper electrode supporting layer forming mask and the lower electrode layer forming mask have been removed;

exposing an upper surface of the upper electrode supporting layer that is to be the region where the ferroelectric capacitor is formed to an upper surface of the insulating layer; and forming an upper electrode layer extending in a second direction on the insulating layer to which the upper surface of the upper electrode supporting layer has been exposed so as to include the region where the ferroelectric capacitor is formed;

the lower electrode layer extending in the first direction and the upper electrode layer extending in the second direction being provided on the semiconductor substrate with the ferroelectric layer and the upper electrode supporting layer therebetween, and the ferroelectric capacitor being disposed at an intersection of the lower electrode layer and the upper electrode layer.

2. The method for manufacturing a semiconductor device according to claim 1, the upper electrode supporting layer forming mask being made of a material having an etching resistance higher than an etching resistance of the lower electrode layer forming mask.

3. The method for manufacturing a semiconductor device according to claim 1, the lower electrode layer forming mask being made of a material having an etching resistance higher than an etching resistance of the upper electrode supporting layer forming mask.

4. The method for manufacturing a semiconductor device according to claim 1, the upper electrode supporting layer being made larger than an area to be occupied by an intersection of the upper electrode layer and the lower electrode layer by using the upper electrode supporting layer forming mask.

* * * * *